United States Patent [19]

Komatsu

[11] Patent Number: 5,508,617
[45] Date of Patent: Apr. 16, 1996

[54] ELECTRIC POWER MEASURING APPARATUS AND METHOD

[75] Inventor: Yasuaki Komatsu, Kobe, Japan

[73] Assignee: Hewlett-Packard Company, Palo Alto, Calif.

[21] Appl. No.: 213,678

[22] Filed: Mar. 16, 1994

[30] Foreign Application Priority Data

Mar. 19, 1993 [JP] Japan ..................... 5-085545

[51] Int. Cl.⁶ .................................................. G01R 11/32
[52] U.S. Cl. ........................ 324/379; 324/141; 324/107
[58] Field of Search ..................... 324/140–142, 324/76.27, 379

[56] References Cited

U.S. PATENT DOCUMENTS

| | | | |
|---|---|---|---|
| 4,775,834 | 10/1988 | Lahti | 324/142 |
| 4,920,312 | 4/1990 | Maruyama | 324/141 |
| 5,262,715 | 11/1993 | King et al. | 324/142 |

FOREIGN PATENT DOCUMENTS 1-285881  11/1989  Japan .

OTHER PUBLICATIONS

Yokogawa, Yokogawa Technical Report, Electric Co., Ltd., May 1992, No. 14, pp. 29–33.

*Primary Examiner*—Kenneth A. Wieder
*Assistant Examiner*—Barry C. Bowser

[57] ABSTRACT

The current invention is directed to a method of measuring an electric power and in particular to a precise power measurement by measuring a current and a voltage of high-frequency distortion waves. The current power measuring method is based upon a summation of the power values measured for every frequency component of the distortion wave. After being frequency converted in a mixer 5, a voltage is inputted from an input terminal 1 through a voltage amplifier 3 to a vector voltmeter 7. A current is supplied into an input terminal 2, and converted into a voltage signal by a current-to-voltage converter 4. Then, the voltage signal is frequency-converted in a mixer 6, and thereafter inputted into a vector voltmeter 8. The input signals to the mixers 5 and 6 are separated into frequency components by sweeping of a local signal generator 10, which are measured by the vector voltmeters. In other words, the vector voltmeter measures effective values of the current and the voltage, and also phase difference values between the current and the voltage for every frequency component. Based on these measured values, a power value for every frequency component is calculated in a computer 9. Furthermore, a summation of power values is calculated to obtain a desirable power value.

4 Claims, 2 Drawing Sheets

ELECTRIC POWER MEASURING APPARATUS AND METHOD

DETAILED DESCRIPTION OF THE INVENTION

1. Field of the Invention

The present invention generally relates to an electric power measuring apparatus and an electric power measuring method. More specifically, the present invention is related to an apparatus for and a method of measuring AC power representing a distorted waveform by obtaining a magnitude and a phase of an each frequency component for a voltage and a current, which constitute the distorted AC power.

2. Background of the Invention

Various conventional AC power measuring methods have been proposed. FIG. 1 shows a block diagram for a conventional AC power measuring method which is usually utilized to measure AC power having the frequencies up to several MHz. A voltage v(t) is applied to a voltage input terminal 1, and a current i(t) is supplied to a current input terminal 2. These voltage and current are respectively converted into proper voltage signals through a voltage amplifier 3 and a current-to-voltage converter 4. In response to a sampling pulse derived from a sampling pulse generator 23, instantaneous values of the voltage and the current are sampled by analog-to-digital converters 21 and 22 so as to convert them into digitized data. Then, a calculation is carried out by a computer 9 in accordance with an approximate expression in Formula (2) based generator 23, instantaneous values of the voltage and the current are sampled by analog-to-digital converters 21 and 22 so as to convert them into digitized data. Then, a calculation is carried out by a computer 9 in accordance with an approximate expression in Formula (2) based upon Formula (1) for defining power. It should be noted that symbol "T" denotes a period of fundamental voltage wave and fundamental current wave, and symbol "N" represents the sampling number within one period. If the sampling number N becomes large, then better approximation is achieved.

$$P = \frac{1}{T} \int_0^T v(t) \cdot i(t) dt \quad (1)$$

$$P = \frac{1}{N} \sum_{k=1}^{N} v\left(\frac{T}{N}k\right) \cdot i\left(\frac{T}{N}k\right) \quad (2)$$

In the method shown in FIG. 1, since the frequency characteristics of the voltage amplifier 3 and the current-to-voltage converter 4 are not flat, a large measurement error may occur in the high frequency region. Although the method for correcting the frequency characteristic of the amplitude has been proposed in this field, a phase correction is technically difficult so that a sufficient phase correction cannot be realized. When the frequency of the measurement signal is increased, the operation frequencies of the analog-to-digital converters 21 and 22 must be set to higher values. However, it is difficult to manufacture or purchase such an analog-to-digital converter with high performance in the high frequency range. Furthermore, commercially available high-frequency/high-precision analog-to-digital converters are expensive.

OBJECT OF THE INVENTION

An object of the present invention is to realize an easy method for correcting frequency characteristics of a voltage amplifier and a current-to-voltage converter. Another object is to measure AC power with high precision in a high frequency range with a low-frequency analog-to-digital converter.

SUMMARY OF THE INVENTION

In the conventional measuring method, AC power is calculated based upon waveform data of a voltage and a current in a time domain. In the current measuring method, AC power is obtained from magnitudes of the respective frequency components and phases of a voltage and a current in a frequency domain. As represented in Formula (3), AC power with distorted waveforms is equal to the sum of power of the respective frequency components. Therefore, effective values of a voltage and a current are measured for every frequency component, and phase differences between the voltage and the current are measured for every frequency component so that power for each frequency component is calculated. The sum of power calculated for the frequency components becomes desirable AC power. According to this measuring method, an easy frequency-characteristic correction is achieved, and AC power is measured with high precision even in a high frequency range.

$$P = \sum_{n=1}^{\infty} V_n I_n \cos\theta_n = \sum_{n=1}^{\infty} P_n \quad (3)$$

Vn: Effective value of voltage of fundamental wave or n-th harmonic

In: Effective value of current of fundamental wave or n-th harmonic

θn: Phase difference between voltage and current of fundamental wave or n-th harmonic Pn: Electrical power of fundamental wave or n-th harmonic The above-described Formula (3) may be derived as follows. Assuming now that no DC component is contained, formula about instantaneous values of a voltage and also a current of a distorted waveform are rexpressed by way of Fourier series:

$$\left. \begin{array}{l} v(t) = \sum_{n=1}^{\infty} V_{mn} \sin(n\omega t + \theta_{vn}) \\ \\ i(t) = \sum_{n=1}^{\infty} I_{mn} \sin(n\omega t + \theta_{in}) \end{array} \right\} \quad (4)$$

It should be noted that symbol "Vmn" denotes a magnitude of voltage, while symbol "Imn" represents a magnitude of current. Symbol "θvn" shows a phase angle of the voltage, and symbol "θin" is a phase angle of the current. Here, assuming that j≠k, power for instantaneous values of this current and voltage is:

$$v(t) \cdot i(t) = \sum_{n=1}^{\infty} V_{mn} I_{mn} \sin(n\omega t + \theta_{vn}) \sin(n\omega t + \theta_{in}) + \quad (5)$$

$$\sum_{j=1}^{\infty} \sum_{k=1}^{\infty} V_{mj} I_{mk} \sin(j\omega t + \theta_{vj}) \sin(k\omega t + \theta_{ik})$$

The power is an average value of formula (5) over 1 time period, as shown in formula (1). An average value of an n-th term over 1 time period within a series of a first term in a right hand of Formula (5) is expressed by:

$$\frac{1}{T} \int_0^T V_{mn} I_{mn} \sin(n\omega t + \theta_{vn}) \sin(n\omega t + \theta_{in}) dt = \quad (6)$$

-continued $$\frac{1}{T}\int_0^T \frac{VmnImn}{2}\{\cos(\theta vn - \theta in) +$$

$$\cos(2n\omega t + \theta vn + \theta in)\}dt =$$

$$\frac{VmnImn}{2}\cos(\theta vn - \theta in) = \frac{VmnImn}{2}\cos\theta n =$$

$$VnIn\cos\theta n$$

An average value of a jk-th term over 1 time period within a series of a second term in a right hand of Formula (5) is expressed by:

$$\frac{1}{T}\int_0^T VmjImk\sin(j\omega t + \theta vj)\sin(k\omega t + \theta ik)dt = \tag{7}$$

$$\frac{1}{T}\int_0^T \frac{VmjImk}{2}\cos((j-k)\omega t + \theta vj - \theta ik)dt +$$

$$\frac{1}{T}\int_0^T \frac{VmjImk}{2}\cos((j+k)\omega t + \theta vn + \theta in)\}dt = 0$$

As a consequence, an average value of Formula (5) over 1 time period becomes series in which Formula (6) is an n-th term so that formula (3) can be obtained.

PREFERRED EMBODIMENTS OF THE INVENTION

Figure 2:
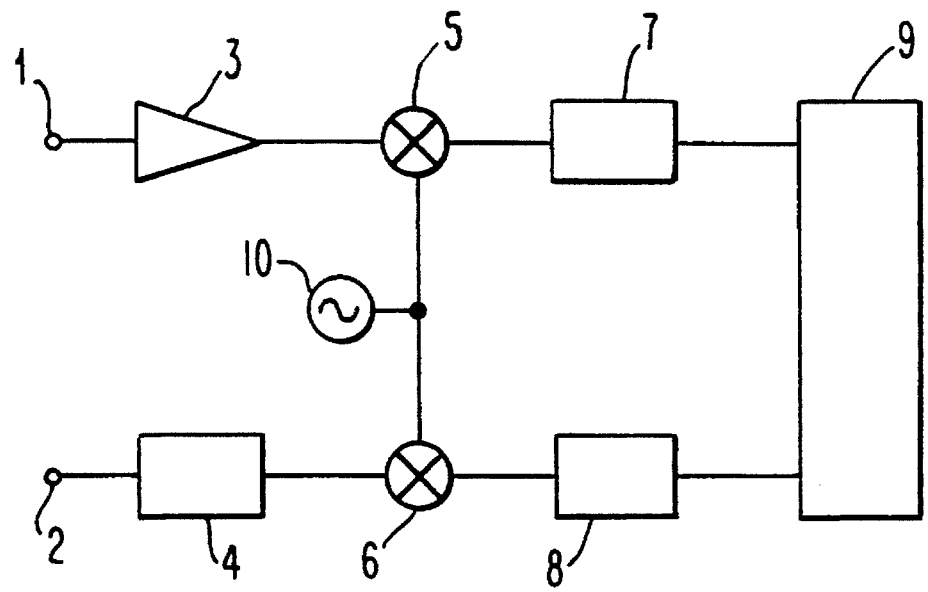
FIG. 2 is a block diagram of a preferred embodiment according to the present invention.

FIG. 2 is a block diagram of a preferred embodiment of the present invention. Similar to the above-described prior art, an input voltage v(t) and an input current i(t) are respectively converted into a proper voltage signal by a voltage amplifier 3 and a current-to-voltage converter 4. For measurements, the voltage signals are respectively supplied to mixers 5 and 6. The input signals of the respective mixers are separated to frequency components and converted into intermediate frequencies by sweeping a local signal oscillator 10. These intermediate frequencies are outputted from the mixers 5 and 6. An effective value and a phase of each intermediate frequency signal are respectively measured by vector voltmeters 7 and 8. The measurement results are inputted into a computer 9. In the computer 9, these measurement values are processed in accordance with the above formula (3) to obtain a desirable power value.

As apparent from the conduction process of formula (3), the magnitudes of the voltage and the current which are employed in the power calculation for every frequency component are not limited to effective values, but maximum values or average values thereof may be utilized after being properly converted. As a consequence, average values, crest values, or other measurement values other than effective values may be measured by a vector voltmeter. Also, it is possible to replace these vector voltmeters 7 and 8 by a single vector voltmeter capable of performing a time divisional measurement.

It should be noted that although an infinite number of frequencies is summed in Formula (3), practically speaking, this calculation must be performed with a certain finite number of frequencies. There is no practical problem when the power measurement is stopped at a finite frequency, since the actual signals having the frequencies higher than the finite frequencies are negligible.

Figure 3:
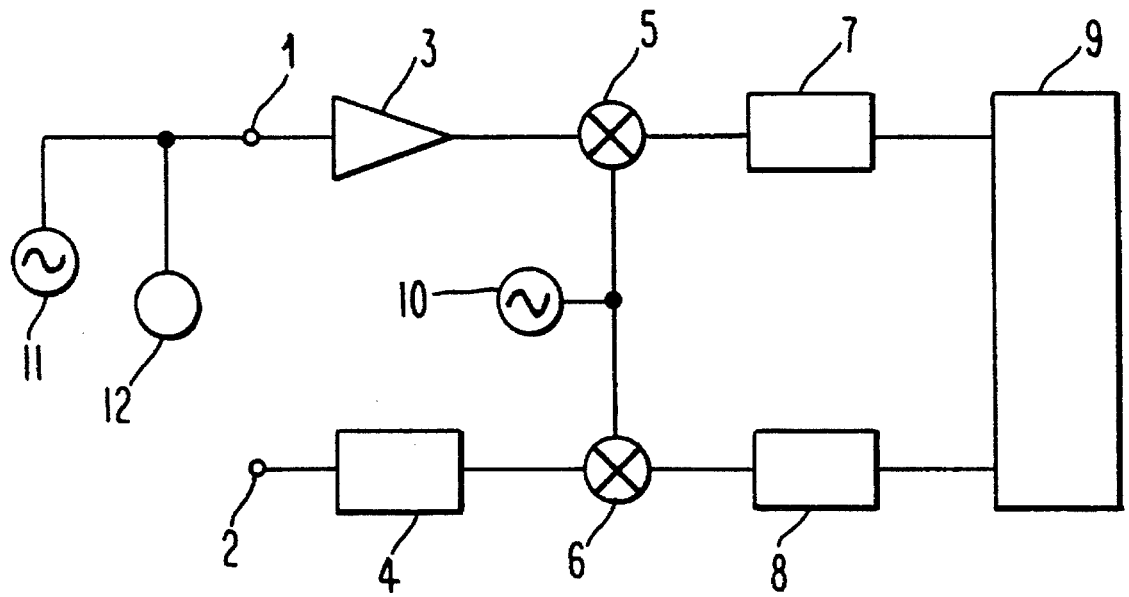
FIG. 3 is a block diagram for illustrating a method for correcting a voltage measurement error in a power measuring apparatus of the present invention.

In accordance with the present invention, since the power calculation is carried out based on the frequency components in the frequency domain, instead of the waveforms in the time domain, a correction of frequency characteristics is more easily performed than the conventional measuring method. First, an example of an effective value correction of a voltage is represented in FIG. 3. A calibrated voltmeter 12 and a signal source 11 are connected to a voltage input terminal 1. A correction coefficient Kv=|Vs|/|Vms| is obtained from this input voltage |Vs| and the measurement value |Vms| of this measuring device. This calculation of correction coefficient is carried out at preselected frequencies to obtain the correction coefficients "Kv" which will then be stored in a memory unit typically employed in the computer 9. A corrected effective value |Vx| of the voltage may be obtained by the following Formula (8):

$$|Vx|=Kv\cdot|Vm| \tag{8}$$

Figure 4:
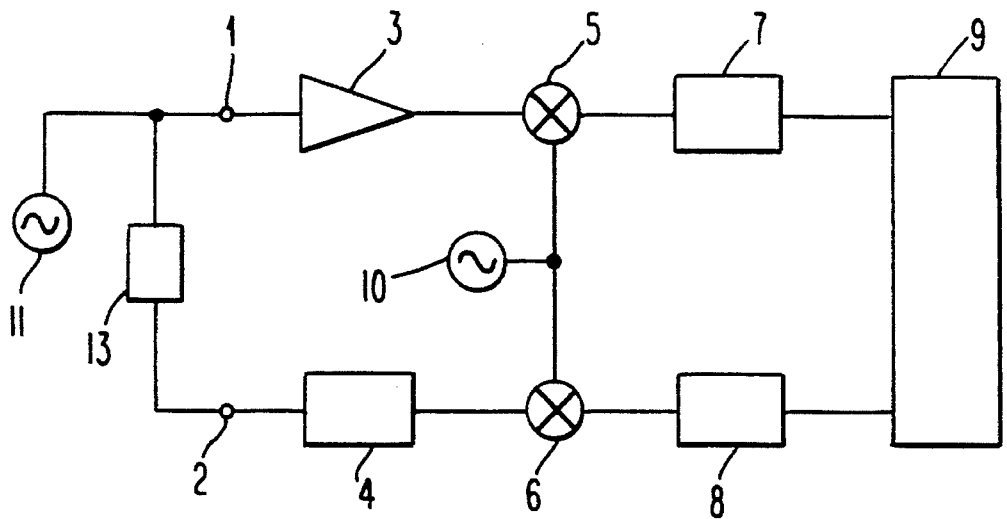
FIG. 4 is a block diagram for illustrating a method for correcting a current measurement error in a power measuring apparatus of the present invention.

It should be noted that symbol |Vm| indicates a measured value of a voltage when power is actually measured. Then, a method of correcting the effective value of the current and the phase difference value between the voltage and the current is realized by applying the conventional OPEN/SHORT/LOAD compensation method of a LCR meter to an arrangement of FIG. 4. An impedance 13 having a known value Zstd (for instance, reference capacitor) is connected to the voltage input terminal 1 and the current input terminal 2, and a sweep signal generator 11 is connected to the voltage terminal 1. With this arrangement, a ratio of the vector measurement value for the voltage to the vector measurement value for the current becomes a measured impedance value. This measured impedance value is expressed as "Zms." Instead of the reference impedance, a measurement value is Zs when a short-circuit plate is connected. Another measurement value is admittance Yo when the input terminals are opened. These measurement values are stored for every frequency. Actually, when power is measured, an impedance Zx corrected by the below-mentioned Formula (9) is calculated based on the impedances Zm obtained from the measurement values of the voltage and the current. The substitution of this Formula (9) will be discussed later.

$$Zx = \frac{Zm - Zs}{1 - ZmYo} \cdot \frac{1 - ZmsYo}{Zms - Zs} \cdot Zstd \tag{9}$$

With the above conditions, both an effective value |Ix| of the current and a phase difference θx between the voltage and the current are obtained from the following Formulae (10) and (11):

$$|Ix| = \frac{|Vx|}{|Zx|} \tag{10}$$

-continued $$\theta x = \tan^{-1}\left(\text{imag}\frac{|Vx|}{Zx} / \text{real}\frac{|Vx|}{Zx}\right) \quad (11)$$

A correction is made to the frequency of the fundamental wave and the frequencies of the harmonic waves, whereby the frequency characteristics of the measurement system is corrected. It should also be noted that symbols Vn, In, θn respectively correspond to |Vx|, |Ix|, θx at each frequency. Based on these values, the finally corrected power is obtained.

Since the above-described correcting method cannot be employed in the conventional power measuring method, the frequency characteristic of the voltage amplifier must be made flat as much as possible. This results in difficulties of adjustments. This adjustment is one of major causes for the measurement error.

Furthermore, since the signal under measurement is down-converted into the intermediate frequency signal by the frequency conversion in accordance with the present invention, the analog-to-digital (A/D) converter employed in the vector voltmeter may be operated at a relatively low speed. Such a low-speed A/D converter provides sufficient resolution and high precision at low cost. As a result, power can be measured with high precision in comparison to the conventional power measuring method in which the voltage/current waveforms are directly A/D-converted.

Figure 5:
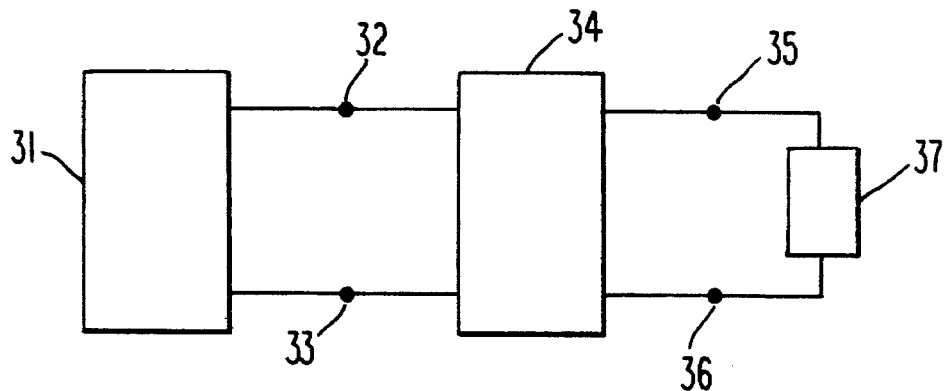
FIG. 5 illustrates an error model for a measuring device.
Figure 1:
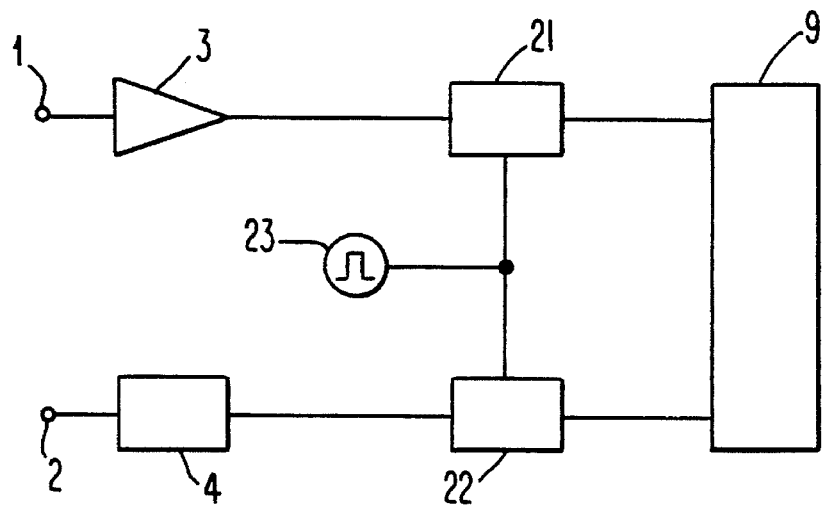
FIG. 1 is a block diagram for illustrating one example of the conventional power measuring apparatus.

The above-explained Formula (9) may be derived as follows. As shown in FIG. 5, an impedance measuring device may be represented by such a model which comprises an ideal measuring device 31 having no error and a two-terminal pair circuit 34 indicative of an error of an actual measuring device at input terminals of the ideal measuring device 31. The left side (the measuring device side) of the terminals 35 and 36 is the actual measuring device whose measurement value is that of the ideal measuring device 31. This corresponds to an impedance as viewed from the right side (an element side to be measured) of the terminals 32 and 33. Assuming now that an impedance of the element to be measured 37 is Zx, a measured value thereof is Zm, and a 4-terminal constant of the 2-terminal pair circuit 34 is ABCD. This measurement value Zm is given as follows:

$$Zm = \frac{AZx + B}{CZx + D} \quad (12)$$

Here, assumed $k_1$=B/A, $k_2$=C/A, and $k_3$=D/A. This formula may be converted as follows:

$$Zm = \frac{Zx + k_1}{k_2 \cdot Zx + k_3} \quad (13)$$

$$Zx = \frac{k_3 \cdot Zm - k_1}{-k_2 \cdot Zm + 1} \quad (14)$$

$$-k_1 + ZxZm \cdot k_2 + Zm \cdot k_3 = Zx \quad (15)$$

If the three unknown numbers $k_1$, $k_2$, $k_3$ become known, a true value Zx whose error has been corrected can be obtained from Formula (14). To this end, measurements are made of the three different known impedances. The known value is substituted for the true value Zx of Formula (15), and the measurement values are substituted for Zm. Thus, simultaneous equations are established. From the simultaneous equations, $k_1$, $k_2$ and $k_3$ indicated in the Formula (16) are obtained. In this case, the three known impedances are respectively selected as an open impedance, a short-circuit impedance, and a reference impedance. Their measurement values are respectively 1/Zo=Yo, Zs, Zms, and the reference impedance is Zstd.

$$\left.\begin{array}{l} k_1 = \dfrac{ZsZstd(1 - YoZms)}{Zms - Zs} \\ k_2 = Yo \\ k_3 = \dfrac{Zstd(1 - YoZms)}{Zms - Zs} \end{array}\right\} \quad (16)$$

These values are substituted for formula (14) to obtain formula (9).

The correction for the frequency characteristics of the measurement system is readily performed in accordance with the present invention. Since the measurement is obtained with a relatively low-speed A/D converter, sufficient resolution and high precision are achieved. The power is measured with high precision even in a high frequency range although such a power measurement in the high frequency range cannot be executed by the conventional measuring method.

It should be noted that the circuit arrangements and the devices employed in the above-explained preferred embodiments are not limited thereto, but may be modified without departing from the technical scope of the present invention.

What is claimed is:

1. A method of measuring an electric power by measuring a voltage and a current using a mixer and a local signal oscillator, said measuring method comprising the steps of:

inputting a voltage and a current;

resolving the voltage and the current into frequency components;

specifying any frequency component to be measured from frequency components including fundamental waves and harmonics of the voltage and the current;

converting the specified frequency components into intermediate frequency signals having a constant frequency by the local signal oscillator coupled to the mixers;

measuring effective values of the voltage and the current, and also a phase difference between the voltage and the current with respect to each of the frequency components through the intermediate frequency signal; and obtaining power based on said measured values at each of the frequency components for a summation of the power of said frequency component.

2. A method of measuring an electric power by measuring a voltage and a current, said measuring method comprising the steps of:

measuring a voltage and a current;

extracting each of frequency components from the voltage and the current;

converting the frequency components into intermediate frequency signals;

measuring effective values of the voltage and the current based on said intermediate frequency signals and a phase difference between the voltage and the current with respect to each of the frequency components; and obtaining power based on said measurement values at each of said frequency components based upon a summation of the power at each of said frequency components.

3. A power measuring apparatus comprising:

an amplifier in response to a voltage signal for amplifying the voltage signal into a properly amplified voltage signal;

a current-to-voltage converter in response to a current signal for converting the current signal into a properly converted voltage signal;

mixers connected the amplifier and the current-to-voltage converter for converting the properly amplified voltage signal and the properly converted voltage signal into an intermediate frequency signal having a constant frequency;

a local signal oscillator coupled to the mixers for outputting a signal having a frequency different from that of the frequency component to be measured of the voltage signal or the current signal by the intermediate frequency;

vector voltage meters for measuring an effective value an a phase based on the intermediate frequency; and a calculator for determining an electric power based on the measured values by the vector voltage meters.

4. The power measuring apparatus as in claim 3, wherein an error is corrected by employing three known impedances of a reference impedance, an open circuit, and a short-circuit.

* * * * *